(12) United States Patent
Miao et al.

(10) Patent No.: US 11,233,198 B2
(45) Date of Patent: *Jan. 25, 2022

(54) THREE-DIMENSIONAL STACKED MEMORY AND PREPARATION METHOD THEREOF

(71) Applicant: HUAZHONG UNIVERSITY OF SCIENCE AND TECHNOLOGY, Hubei (CN)

(72) Inventors: Xiangshui Miao, Hubei (CN); Hao Tong, Hubei (CN); Yushan Shen, Hubei (CN)

(73) Assignee: HUAZHONG UNIVERSITY OF SCIENCE AND TECHNOLOGY, Hubei (CN)

(*) Notice: Subject to any disclaimer, the term of this patent is extended or adjusted under 35 U.S.C. 154(b) by 0 days.

This patent is subject to a terminal disclaimer.

(21) Appl. No.: 17/040,998

(22) PCT Filed: Aug. 9, 2018

(86) PCT No.: PCT/CN2018/099519
§ 371 (c)(1),
(2) Date: Sep. 24, 2020

(87) PCT Pub. No.: WO2019/227671
PCT Pub. Date: Dec. 5, 2019

(65) Prior Publication Data
US 2021/0104670 A1    Apr. 8, 2021

(30) Foreign Application Priority Data
May 30, 2018   (CN) .......................... 201810541298.5

(51) Int. Cl.
*H01L 45/00*     (2006.01)
*H01L 27/24*     (2006.01)

(52) U.S. Cl.
CPC ...... *H01L 45/1683* (2013.01); *H01L 27/2481* (2013.01); *H01L 45/06* (2013.01); *H01L 45/1253* (2013.01)

(58) Field of Classification Search
CPC .................................................. H01L 45/1683
See application file for complete search history.

(56) References Cited

U.S. PATENT DOCUMENTS 6,351,406 B1 * 2/2002 Johnson .............. G11C 11/5692
365/103
8,698,119 B2 * 4/2014 Tendulkar ........... H01L 45/1616
257/4

(Continued)

FOREIGN PATENT DOCUMENTS

CN     1411074      4/2003
CN     101350360    1/2009

(Continued)

OTHER PUBLICATIONS

"International Search Report (Form PCT/ISA/210) of PCT/CN2018/099519," dated Feb. 27, 2019, pp. 1-4.

*Primary Examiner* — Mounir S Amer
(74) *Attorney, Agent, or Firm* — JCIP Global Inc.

(57) ABSTRACT

The disclosure discloses a three-dimensional stacked memory and a preparation method thereof. The storage unit adopts a constrained structure phase change storage unit, and uses a crossbar storage array structure to build a large-capacity storage array. The preparation method includes: preparing N first strip-shaped electrodes along a crystal direction on a substrate; preparing a first insulating layer with M*N array of through holes; filling the M*N array of through holes of the first insulating layer with a phase change material to form first phase change units; preparing M second strip-shaped electrodes; preparing a second insulating layer, using spin-coated photoresist as a (Continued)

sacrificial material, performing a local planarization on the surface of the second insulating layer; forming M*N array of through holes on the second insulating layer; filling a phase change material to form second phase change units; preparing N third strip-shaped electrodes to form a two-layer stacked phase change memory.

14 Claims, 3 Drawing Sheets

(56) References Cited

U.S. PATENT DOCUMENTS

2014/0291603 A1* 10/2014 Song .................. H01L 45/145
                                                                          257/4
2021/0280784 A1* 9/2021 Miao .................. H01L 27/249

FOREIGN PATENT DOCUMENTS

| CN | 101477987 | 7/2009 |
| CN | 104051021 | 9/2014 |

* cited by examiner

THREE-DIMENSIONAL STACKED MEMORY AND PREPARATION METHOD THEREOF

CROSS-REFERENCE TO RELATED APPLICATION

This application is a 371 of international application of PCT application serial no. PCT/CN2018/099519, filed on Aug. 9, 2018, which claims the priority benefit of China application no. 201810541298.5, filed on May 30, 2018. The entirety of each of the above mentioned patent applications is hereby incorporated by reference herein and made a part of this specification.

BACKGROUND

Field of the Disclosure

The disclosure relates to the technical field of microelectronic devices and memories, and particularly relates to a three-dimensional stacked memory and a preparation method thereof.

Description of Related Art

With the continuous development of information storage technology in the era of big data, people have higher expectation and requirement for the storage capacity integration density and manufacturing cost of non-volatile memory. In order to achieve higher data storage density and lower unit bit cost of semiconductor memory chips to improve their competitiveness in the storage market, the development trend of semiconductor memory has developed from two-dimensional semiconductor memory to three-dimensional semiconductor memory.

Phase change memory is a new type of non-volatile memory. Through applying specific pulses to chalcogenide-based phase change materials, the phase change memory undergoes rapid transformation between ordered crystalline state (low resistance) and disordered crystalline state (high resistance), thereby achieving data storage. Due to its excellent performance such as fast read and write speed, low power consumption, high switch window ratio, good data retention, resistance to thermal crosstalk and radiation resistance, the phase change memory is now considered to be the most likely to replace flash memory and become one of the mainstream non-volatile memories in the future.

The manufacturing process of the phase change memory is simple and compatible with the current mature CMOS process. Therefore, in terms of structure and process, it is relatively easy to realize multi-layer stacking of three-dimensional memory to meet the requirement for high integration density. At present, two-dimensional planar phase change memory has encountered physical limitations in the reduction of device size. Due to the reduction of feature size, crosstalk between units increases, and the effect of leakage currents is severe, resulting in decrease of device reliability. Therefore, three-dimensional stacking technology is introduced into the manufacturing process of phase change memory, leading to a three-dimensional stacked phase change structure.

Three-dimensional stacking of phase change memory encounters problems in terms of material selection, device structure, process implementation difficulty and cost. As far as the device structure of the current three-dimensional stacked memory is concerned, the structure adopted is relatively complex, which makes the process difficult to be implemented, and the actual manufacturing yield is low. As for the manufacturing process of the current three-dimensional stacked memory, the process steps are relatively complicated and involve multiple-layer hole etching and filling as well as the CMP planarization process for each layer, which are costly and not conducive for stacking more layers.

SUMMARY OF THE DISCLOSURE

In view of the shortcomings of the related art, the purpose of the disclosure is to provide a preparation method for three-dimensional stacked memory, which aims to solve the problems in the existing manufacturing process of three-dimensional stacked memory devices, namely complicated steps, high difficulty in process implementation and low yield rate.

The preparation method for three-dimensional stacked memory provided by the disclosure includes the following steps:

(1) Preparing N first strip-shaped electrodes along a certain crystal direction on a substrate;

(2) Preparing a first insulating layer with M*N array of through holes on the first strip-shaped electrodes;

(3) Filling a phase change material in the M*N array of through holes of the first insulating layer to form first phase change units;

(4) On the structure formed in step (3), preparing M second strip-shaped electrodes whose direction is orthogonal to the first strip-shaped electrodes and line width is the same as the first strip-shaped electrodes;

(5) On the structure formed in step (4), preparing a second insulating layer whose thickness is twice or more than the thickness of the first insulating layer;

(6) Spin-coating photoresist on the structure formed in step (5) as a sacrificial material, and using an etching process to perform a local planarization operation on the surface of the second insulating layer;

(7) Performing over-etching on the second insulating layer at positions corresponding to the through holes of the first insulating layer to form M*N array of through holes;

(8) Filling the phase change material into the M*N array of through holes of step (7) to form second phase change units;

(9) On the structure formed in step (8), preparing N third strip-shaped electrodes whose direction is orthogonal to the second strip-shaped electrodes and line width is the same as the second strip-shaped electrodes to form a two-layer stacked phase change memory.

Specifically, the spin-coated photoresist is adopted as a sacrificial material, and an etching process such as ICP or RIE is adopted to locally planarize the surface of the second insulating layer, so that the thickness of the insulating layer after planarizing is the same as that of the first insulating layer. In addition, the planarization operation is only performed on the second insulating layer with high unevenness, which can simplify the process while ensuring reliability.

Furthermore, the line width of the first strip-shaped electrode is 2 μm to 30 μm.

Furthermore, in step (3), the area of the first phase change unit is larger than the cross-sectional area of the through hole and smaller than the area of the electrode overlapping region.

Furthermore, in step (4), the region where the first phase change unit is located is in the space overlapping region of the first strip-shaped electrode and the second strip-shaped electrode.

Furthermore, after step (9), the preparation method further includes the following steps.

The preparation of two or more layers of three-dimensional stacked memory is performed by repeating the stacking based on the above steps. The area of the rectangular region occupied by each insulating layer is ensured being decreased with the increase of number of layers stacked, the pin of the electrode of each layer is exposed, and the stacking is upwardly performed to form a step structure with a substantial square frustum shape.

Furthermore, the strip-shaped electrodes in the odd-numbered layers have the same number, line width and direction except that the lengths thereof decrease with the increase of the number of layers. The planarization operation is performed to the insulating layers in even-numbered layers so as to ensure the reliability of the device while simplifying the process steps.

In the embodiment of the disclosure, photolithography adopts the design of multiple sets of alignment marks, and a new set of alignment marks is introduced in the nesting process of the common electrode. The new set of alignment marks is dominant in alignment, and the previous alignment marks are adopted as auxiliary to improve the nesting accuracy.

The disclosure further provides a three-dimensional stacked memory obtained based on the above-mentioned preparation method. The three-dimensional stacked memory prepared by the above-mentioned method can improve the storage density.

More preferably, the three-dimensional structure of the three-dimensional stacked memory may adopt a unit structure such as a constrained structure, a five-layer T-shaped structure and an asymmetric structure, and combined with a crossbar array structure.

More preferably, the insulating layer is made of silicon dioxide or a material with lower thermal conductivity and electrical conductivity, and the insulating layer may also be doped to reduce the thermal conductivity and electrical conductivity. In the meantime, the insulating layer may be prepared by using a chemical vapor deposition process at a temperature below 150° C.

More preferably, the film thickness of the phase change units is slightly larger than the depth of the array of through holes to be filled, so that the phase change units completely fill the through holes and are limited in the through holes.

More preferably, the shape of the phase change unit is similar to the shape of the through hole of the insulating layer, and the size of the phase change unit is between the size of the through hole of the insulating layer and the line width of the electrode.

Based on the basic unit array structure of the phase change memory, the disclosure adopts a constrained-crossbar array three-dimensional stacked memory structure with simple structure and low implementation difficulty.

In the disclosure, the three-dimensional stacked memory unit structure and the preparation method thereof adopt a constrained structure phase change memory unit as a basis, and use a crossbar structure to build a large-capacity storage array. By using insulating layers with large area and array of through holes, it is possible to realize the electrode isolation in the vertical direction, while the phase change material can be effectively limited in the through hole, which is beneficial to improve the heat utilization rate and reduce the operating current for phase change of the unit. In the preparation process, the manufacturing process of the phase change memory is integrated, so that the preparation of insulating layer reduces the frequency of photolithography and etching processes. The etching process is adopted to perform planarization operation to the insulating layers with higher unevenness, such that the reliability of the device can be ensured while the process cost can be reduced.

Specifically, (a1) is a schematic view of the selected substrate;

(a2) is a schematic view of preparing first strip-shaped electrodes on the surface of the substrate;

(a3) is a schematic view of preparing a first insulating layer with array of through holes on the first electrodes;

(a4) is a schematic view of filling a phase change material in the array of through holes of the first insulating layer to form first phase change units;

(a5) is a schematic view of preparing second strip-shaped electrodes that are orthogonal to the first strip-shaped electrodes on the underlying structure;

(a6) is a schematic view of preparing a thicker second insulating layer on the second strip-shaped electrodes;

(a7) is a schematic view of spin-coating photoresist as a sacrificial material on the underlying structure;

(a8) is a schematic view of performing a local planarization to the second insulating layer and removing the photoresist;

(a9) is a schematic view of preparing array of through holes on the second insulating layer at the same positions as the first insulating layer;

(a10) is a schematic view of filling a phase change material in the array of through holes of the second insulating layer to form second phase change units;

(a11) is a schematic view of preparing third strip-shaped electrodes that are orthogonal to the second strip-shaped electrodes on the underlying structure.

Figure 3:
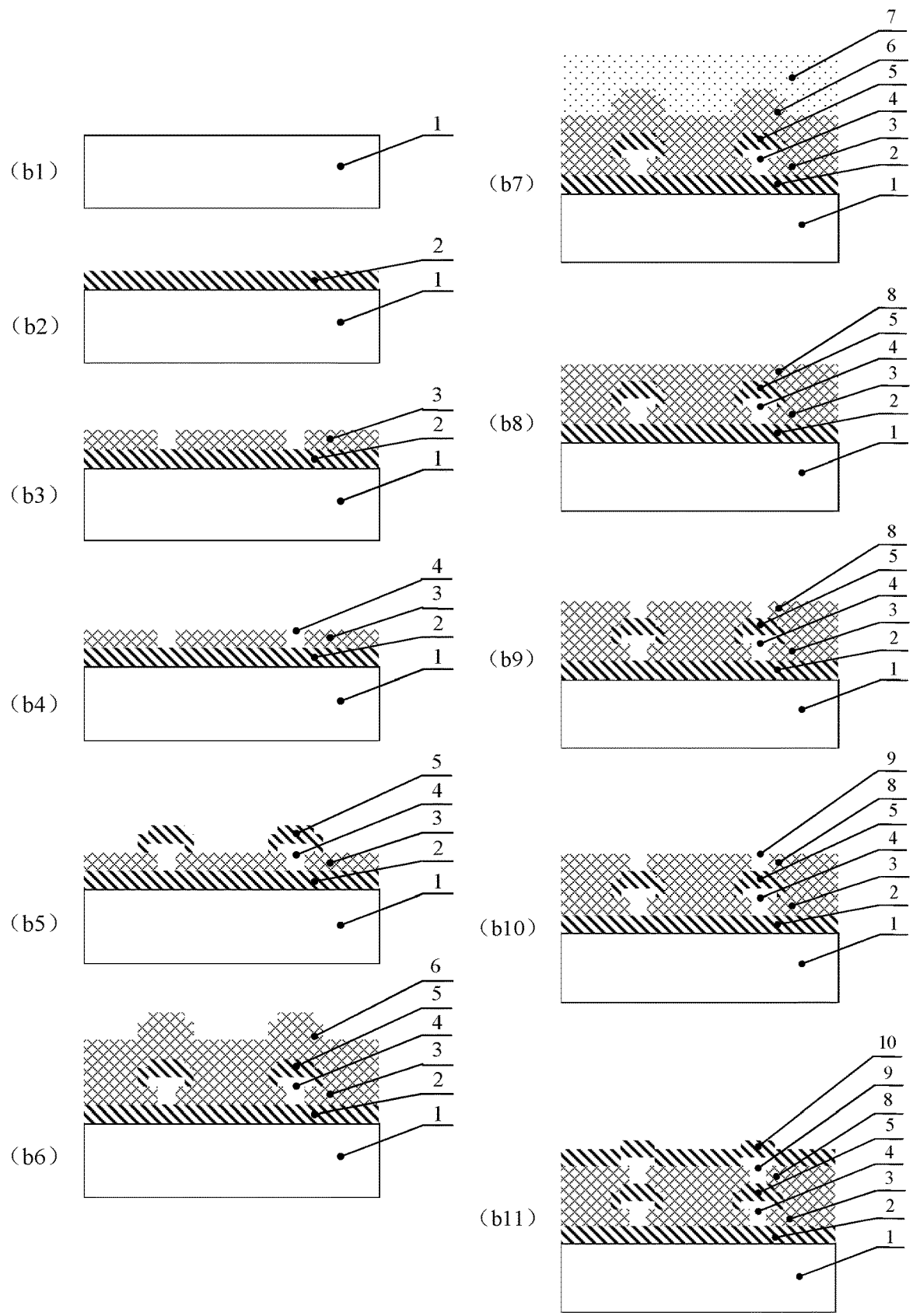

FIG. 3 is a schematic view of a preparation flowchart of the two-layer stack in the three-dimensional stacked memory along a WL cross-sectional direction in an embodiment of the disclosure.

Specifically, the process shown in schematic views (b1) to (b1) corresponds to the process shown in (a1) to (a11).

DESCRIPTION OF EMBODIMENTS

In order to make the purpose, technical solutions, and advantages of the disclosure clearer, the following further describes the disclosure in detail with reference to the accompanying drawings and embodiments. It should be understood that the specific embodiments described here are only used to explain the disclosure, but not to limit the disclosure.

Figure 1:
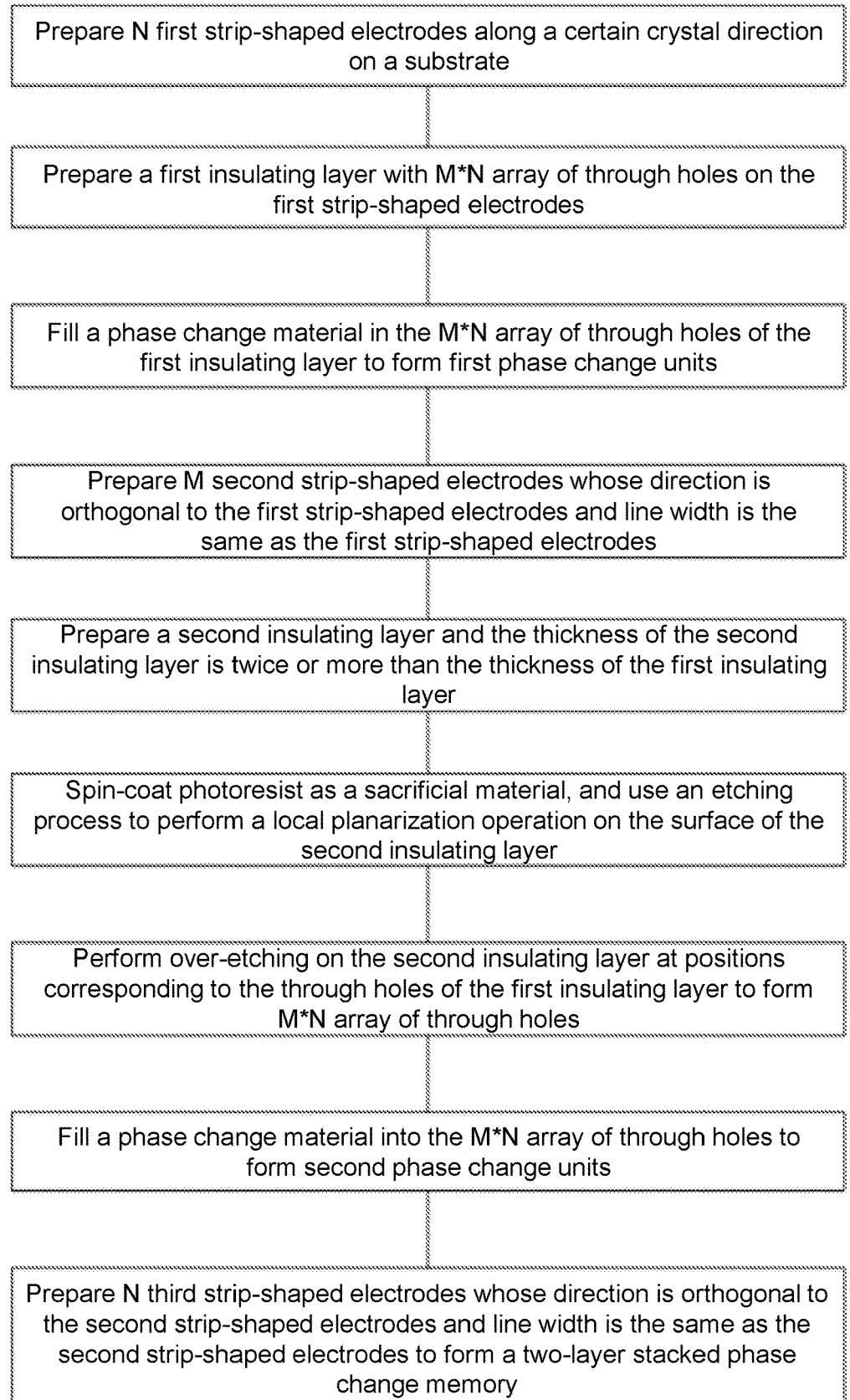
FIG. 1 is an implementation flowchart of a preparation method for a three-dimensional stacked memory provided by an embodiment of the disclosure.

As shown in FIG. 1, the disclosure provides a preparation method for a three-dimensional stacked memory, which specifically includes the following steps.

(1) N first strip-shaped electrodes with a line width of 2 μm to 30 μm are prepared along a certain crystal direction on the substrate.

Specifically, N is smaller than the maximum value of the number of first strip-shaped electrodes that the substrate can accommodate along the said direction. In order to increase the storage density of the memory as much as possible, the value of N should be as large as possible within the value range.

Furthermore, the material of the first strip-shaped electrode may be made of materials that are not easy to oxidize, have good electrical conductivity (electrical conductivity greater than 10E5, and the larger the better) and higher melting point (melting point greater than 700 degrees Celsius), such as TiW alloy, Ti, Pt, and so on.

(2) A first insulating layer with M*N array of through holes is prepared on the first strip-shaped electrodes.

Specifically, M is smaller than the maximum value of the number of strip-shaped electrodes that the substrate can accommodate along the direction perpendicular to the first strip-shaped electrode. In order to increase the storage density as much as possible, the value of M should be as large as possible within the value range. Moreover, the first insulating layer is an insulating layer with a regular shape. When the first insulating layer is rectangular, the utilization rate of the substrate surface may be increased, thereby increasing the storage density.

Furthermore, the material of the rectangular insulating layer is $SiO_2$, or a material with lower thermal conductivity and electrical conductivity than $SiO_2$, and the material of the rectangular insulating layer may also be doped to reduce thermal conductivity and electrical conductivity, such as $ZnS$—$SiO_2$.

Specifically, firstly, a photolithography process is adopted to prepare an insulating layer pattern with M*N array of through holes on the strip-shaped electrodes, and then an insulating layer with array of through holes is obtained by depositing an insulating material and performing a peeling process. The insulating layer structure realizes effective electrical and thermal isolation between electrodes in both vertical and horizontal directions, while the through holes on the insulating layer structure serve the function of limiting the size of the phase change units, thus helping to reduce negative impacts brought by thermal crosstalk and leakage current on adjacent units.

(3) A phase change material is filled in the M*N array of through holes of the first insulating layer to form first phase change units.

Specifically, the area of the first phase change unit is larger than the cross-sectional area of the through hole and smaller than the area of the electrode overlapping region, so that the phase change material completely fills the through hole and is wrapped by surrounding materials, thereby improving the reliability of the unit. Specifically, the phase change material may be chalcogenide compounds, such as $GeTe$, $Sb_2Te_3$ and $Ge_2Sb_2Te_5$.

(4) M second strip-shaped electrodes whose direction is orthogonal to the first strip-shaped electrodes and line width is the same as the first strip-shaped electrodes are prepared on the structure formed in step (3).

Specifically, the region where the first phase change unit is located is completely located in the space overlapping region of the first strip-shaped electrode and the second strip-shaped electrode.

(5) A second insulating layer is prepared on the structure formed in step (4), and the thickness of the second insulating layer is twice or more than the thickness of the first insulating layer.

(6) Photoresist is spin-coated on the structure formed in step (5) as a sacrificial material, and an etching process is utilized to perform a local planarization operation on the surface of the second insulating layer. The photoresist is adopted as the sacrificial material and the etching process is adopted for performing planarization operation to avoid the "dish defect" of the CMP process occurred in the case that line spacing is micrometer-level, as well as to avoid negative impacts brought to the exposed pin of underlying electrode and other films.

Specifically, the process parameters of the etching process should meet the following conditions. The parameters, such as temperature, etching gas flow, pressure, power, should be selected properly so that the etching rate of the material of the second insulating layer is close to the etching rate of the photoresist. Meanwhile, the remaining thickness of the second insulating layer after etching is the same as the thickness of the first insulating layer.

(7) Photolithography and etching processes are performed to the second insulating layer to perform over-etching at positions corresponding to the through holes of the first insulating layer to form M*N array of through holes.

(8) A phase change material is filled into the M*N array of through holes of step (7) to form second phase change units.

(9) N third strip-shaped electrodes whose direction is orthogonal to the second strip-shaped electrodes and line width is the same as the second strip-shaped electrodes are prepared on the structure, and then a two-layer stacked phase change memory is formed.

(10) The preparation of more layers of three-dimensional stacked memory is performed by repeating the stacking based on the above steps. The area of the rectangular region occupied by each insulating layer is ensured being decreased with the increase of number of layers stacked, the upper structure is completely located above the underlying insulating layer, the pin of the underlying electrode layer is exposed, and the stacking is upwardly performed to form a step structure with a substantial square frustum shape.

Specifically, the strip-shaped electrodes in the odd-numbered layers have the same number, line width and direction except that the lengths thereof decrease with the increase of the number of layers. The strip-shaped electrodes in the even-numbered layers have the same number, line width and direction except that the lengths thereof decrease with the increase of the number of layers.

In addition, the planarization operation is performed to the even-numbered insulating layers, which may ensure reliability of device while simplifying the process.

This embodiment provides a specific implementation of a three-dimensional stacked memory and a preparation method thereof. Taking a two-layer stacked memory as an example, the process includes the following steps.

Specific Embodiment 1

Figure 2:
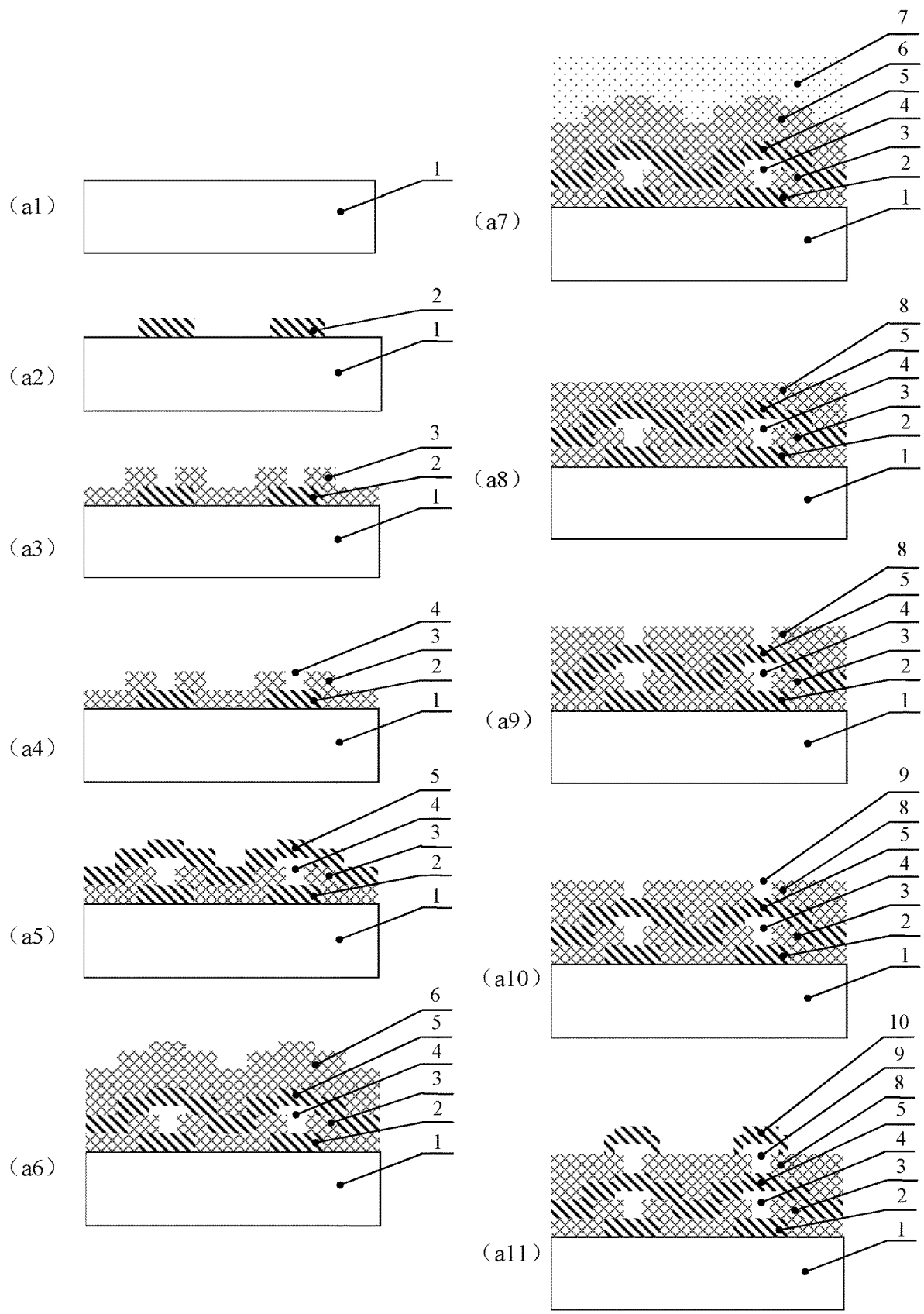
FIG. 2 is a schematic view of a preparation flowchart of the two-layer stack in the three-dimensional stacked memory along a BL cross-sectional direction in an embodiment of the disclosure.

Step 1: On a silicon substrate 1 with a 1000 nm thick $SiO_2$ oxide layer on its surface, photolithography is performed to obtain a pattern of a number of first strip-shaped electrodes with a line width of 10 μm along a certain crystal direction. A 100 nm thick TiW alloy electrode material is deposited on the substrate after photolithography, and after performing a peeling process, first strip-shaped electrodes 2 corresponding to the photolithographic pattern are obtained, as shown in (a1 to a2) of FIG. 2 and (b1 to b2) of FIG. 3.

Step 2: On the basis of Step 1, photolithography is performed to obtain a pattern of a rectangular first insulating layer with a larger area and array of through holes. The pattern covers the effective region of the first strip-shaped electrode and exposes the pins at both ends of the first strip-shaped electrode. The size of each of the array of through holes is 4 μm, and all the array of through holes are located on the first strip-shaped electrodes. Then, the electrothermal insulating material $SiO_2$ is deposited. Preferably, a plasma enhanced chemical vapor deposition (PECVD) process is adopted to prepare 100 nm thick $SiO_2$ at a cavity temperature of 100° C. After a peeling process is performed, a first insulating layer 3 with array of through holes covering the first strip-shaped electrodes and corresponding to the photolithographic pattern is obtained, as shown in (a3) of FIG. 2 and (b3) of FIG. 3.

Step 3: On the basis of Step 2, photolithography is performed to obtain a pattern of array of first phase change units. Each unit of the pattern is located directly above the array of through holes of the first insulating layer, the size of each unit is 6 μm, and each unit completely covers the through hole of the insulating layer. Then, the $Ge_2Sb_2Te_5$ phase change material with a thickness of 120 nm is deposited by DC magnetron sputtering to fill the through holes of the underlying insulating layer. After a peeling process is performed, array of first phase change units 4 filled in the array of through holes are obtained, as shown in (a4) of FIG. 2 and (b4) of FIG. 3.

Step 4: On the basis of Step 3, photolithography is performed to obtain a pattern of second strip-shaped electrodes, which are a number of strip-shaped electrodes orthogonal to the first strip-shaped electrode and completely located above the first insulating layer. The through holes of the insulating layer and the array of first phase change units are located in the space overlapping regions of the first strip-shaped electrodes and the second strip-shaped electrodes. Then, 100 nm thick TiW is deposited on the photolithographic pattern, and the corresponding second strip-shaped electrodes 5 with a line width of 10 μm are obtained after peeling, as shown in (a5) of FIG. 2 and (b5) of FIG. 3.

Step 5: On the basis of Step 4, photolithography is performed to obtain a pattern of a second insulating layer, which is a rectangular pattern that completely covers the underlying array of phase change units and the effective region of the electrodes, and exposes the pins at both ends of each electrode. After photolithography is performed, a PECVD process is adopted to prepare $SiO_2$ with a thickness of 300 nm at a cavity temperature of 100° C., and then peeling is performed to obtain a second insulating layer 6 corresponding to the photolithographic pattern, as shown in (a6) of FIG. 2 and (b6) of FIG. 3.

Step 6: On the basis of Step 5, preferably, an etching process is selected to perform a local planarization operation on the surface of the second insulating layer. A layer of photoresist 7 is spin-coated to completely cover the entire sample. Then an etching process such as ICP or RIE is adopted, with $CHF_3$ and $O_2$ as the main etching gases, and under specific etching parameters, $SiO_2$ and the photoresist are etched at the same rate, so that the thickness of the remaining insulating material on the underlying electrodes is close to 100 nm. After removing the photoresist, a second insulating layer 8 with a relatively flat surface is obtained, as shown in (a7 to a8) of FIG. 2 and (b7 to b8) of FIG. 3.

Step 7: On the basis of Step 6, at the same position as the region of the array of first phase change units, that is, the electrode crossing region, after performing photolithography to obtain a pattern of array of through holes of an insulating layer, an etching process is utilized to perform micro over-etching, and then an array of through holes are obtained on the second insulating layer. The feature size of the through hole is 4 μm, and the bottom of through hole is the surface of the second strip-shaped electrode, as shown in (a9) of FIG. 2 and (b9) of FIG. 3.

Step 8: On the basis of Step 7, photolithography is performed to obtain a pattern of array of second phase change units, the pattern is located directly above the through holes of the underlying insulating layer, the size of each unit is 6 μm, and each unit completely covers the through hole of the insulating layer. Then, DC magnetron sputtering is performed to deposit the $Ge_2Sb_2Te_5$ phase change material with a thickness of 120 nm to fill the through holes of the underlying insulating layer. After a peeling process is performed, array of second phase change units 9 are obtained, as shown in (a10) of FIG. 2 and (b10) of FIG. 3.

Step 9: On the basis of Step 8, photolithography is performed to obtain a pattern of third strip-shaped electrodes, whose number of electrodes, line width and direction are the same as the first strip-shaped electrode. The pattern of third strip-shaped electrodes is completely located on the second insulating layer and completely covers the array of second phase change units. After photolithography is performed, 100 nm thick TiW electrode material is deposited on the surface. After a peeling process is performed, third strip-shaped electrodes 10 corresponding to the photolithographic pattern are obtained, as shown in (a11) of FIG. 2 and (b11) of FIG. 3.

To prepare more layers of three-dimensional stacked memory, further stacking may be performed based on steps 2 to 9.

Specific Embodiment 2

Step 1: On a silicon substrate 1 with a 1000 nm thick $SiO_2$ oxide layer on its surface, photolithography is performed to obtain a pattern of a number of strip-shaped electrodes with a line width of 6 μm along a certain crystal direction. A 20 nm thick Ti and 80 nm thick Pt electrode materials are deposited in sequence on the substrate after photolithography, and after performing a peeling process, first strip-shaped electrodes 2 corresponding to the photolithographic pattern are obtained, as shown in (a1 to a2) of FIG. 2 and (b1 to b2) of FIG. 3.

Step 2: On the basis of Step 1, photolithography is performed to obtain a pattern of a rectangular first insulating layer with a larger area and array of through holes. The pattern covers the effective region of the first strip-shaped electrode and exposes the pins at both ends of the first strip-shaped electrode. The size of each of the array of through holes is 2 μm, and all the array of through holes are located on the underlying electrodes. Then, the electrothermal insulating material $ZnS$—$SiO_2$ having a thickness of 90 nm is deposited on the photolithographic pattern. After a peeling process is performed, a corresponding first insulating layer 3 with array of through holes covering the first strip-shaped electrodes is obtained, as shown in (a3) of FIG. 2 and (b3) of FIG. 3.

Step 3: On the basis of Step 2, photolithography is performed to obtain a pattern of array of first phase change units. Each unit of the pattern is located directly above the array of through holes of the first insulating layer, the size of each unit is 4 μm, and each unit completely covers the through hole of the insulating layer. Then, the $GeTe$—$Sb_2Te_3$ phase change material with a thickness of 100 nm is deposited by DC magnetron sputtering to fill the through holes of the underlying insulating layer. After a peeling process is performed, array of first phase change units 4 filled in the array of through holes are obtained, as shown in (a4) of FIG. 2 and (b4) of FIG. 3.

Step 4: On the basis of Step 3, photolithography is performed to obtain a pattern of second strip-shaped electrodes, which are a number of strip-shaped electrodes orthogonal to the first strip-shaped electrode and completely located above the first insulating layer. The through holes of the insulating layer and the array of first phase change units are located in the space overlapping regions of the first strip-shaped electrodes and the second strip-shaped electrodes. Then, 100 nm thick Pt is deposited on the surface, and second strip-shaped electrodes 5 with a line width of 6 µm and corresponding to the photolithographic pattern are obtained after peeling, as shown in (a5) of FIG. 2 and (b5) of FIG. 3.

Step 5: On the basis of Step 4, photolithography is performed to obtain a pattern of a second insulating layer, which is a rectangular pattern that completely covers the underlying array of phase change units and the effective region of the electrodes, and exposes the both ends of each electrode. After photolithography is performed, $ZnS-SiO_2$ is deposited with a thickness of 300 nm, and then peeling is performed to obtain a second insulating layer 6 corresponding to the photolithographic pattern, as shown in (a6) of FIG. 2 and (b6) of FIG. 3.

Step 6: On the basis of Step 5, preferably, spin-coated photoresist is adopted as a sacrificial material, and the insulating material and the photoresist are etched at the same rate under specific parameters by using an etching process, so that the remaining insulating material on the underlying electrodes has a thickness close to 90 nm. After removing the photoresist, a second insulating layer 8 with a relatively flat surface is obtained, as shown in (a7 to a8) of FIG. 2 and (b7 to b8) of FIG. 3.

Step 7: On the basis of Step 6, at the same position as the region of the array of first phase change units, that is, the electrode crossing region, after performing photolithography to obtain a pattern of array of through holes of an insulating, an etching process is utilized to perform micro over-etching, so that array of through holes are obtained on the second insulating layer. The feature size of the through hole is 2 µm, and the bottom of the through hole is the surface of the second strip-shaped electrode, as shown in (a9) of FIG. 2 and (b9) of FIG. 3.

Step 8: On the basis of Step 7, photolithography is performed to obtain a pattern of array of second phase change units, the pattern is located directly above the through holes of the underlying insulating layer, the size of each unit is 4 µm, and each unit completely covers the through hole of the insulating layer. Then magnetron sputtering is performed to deposit the $GeTe-Sb_2Te_3$ phase change material with a thickness of 100 nm to fill the through holes of the underlying insulating layer. After a peeling process is performed, array of second phase change units 9 are obtained, as shown in (a10) of FIG. 2 and (b10) of FIG. 3.

Step 9: On the basis of Step 8, photolithography is performed to obtain a pattern of third strip-shaped electrodes, whose number of electrodes, line width and direction are the same as the first strip-shaped electrode. The pattern of third strip-shaped electrodes is completely located on the second insulating layer and completely covers the array of second phase change units. After photolithography is performed, 100 nm thick Pt electrode material is deposited on the surface. After a peeling process is performed, third strip-shaped electrodes 10 corresponding to the photolithographic pattern are obtained, as shown in (a11) of FIG. 2 and (b11) of FIG. 3.

To prepare more layers of three-dimensional stacked memory, further stacking may be performed based on steps 2 to 9.

The above-mentioned specific embodiments describe in detail the purpose of the disclosure to achieve the three-dimensional stacked memory device and the technical solution for simplifying the manufacturing process. It should be understood that any modifications and changes that are within the scope of claims of the disclosure should be considered as belonging to the scope to be protected by the disclosure. Those skilled in the art can easily understand that the above descriptions are only preferred embodiments of the disclosure and are not intended to limit the disclosure. Any modification, equivalent replacement and improvement, etc. made within the spirit and principle of the disclosure should fall within the protection scope of the disclosure.

What is claimed is:

1. A preparation method for a three-dimensional stacked memory, comprising following steps:
    (1) preparing N first strip-shaped electrodes along a crystal direction on a substrate;
    (2) preparing a first insulating layer with M*N array of through holes on the first strip-shaped electrodes;
    (3) filling a phase change material in the M*N array of through holes of the first insulating layer to form first phase change units;
    (4) on a structure formed in step (3), preparing M second strip-shaped electrodes whose direction is orthogonal to the first strip-shaped electrodes and line width is the same as the first strip-shaped electrodes;
    (5) on a structure formed in step (4), preparing a second insulating layer whose thickness is twice or more than a thickness of the first insulating layer;
    (6) spin-coating photoresist on a structure formed in step (5) as a sacrificial material, and using an etching process to perform a local planarization operation on a surface of the second insulating layer;
    (7) performing over-etching on the second insulating layer at positions corresponding to the M*N array of through holes of the first insulating layer to form M*N array of through holes;
    (8) filling a phase change material into the M*N array of through holes of step (7) to form second phase change units;
    (9) on a structure formed in step (8), preparing N third strip-shaped electrodes whose direction is orthogonal to the second strip-shaped electrodes and line width is the same as the second strip-shaped electrodes to form a two-layer stacked phase change memory.

2. The preparation method according to claim 1, wherein a line width of the first strip-shaped electrode is 2 µm to 30 µm.

3. The preparation method according to claim 1, wherein, in step (3), an area of the first phase change unit is larger than a cross-sectional area of the through hole and smaller than an area of an electrode overlapping region.

4. The preparation method according to claim 1, wherein, in step (4), a region where the first phase change unit is located is in a space overlapping region of the first strip-shaped electrode and the second strip-shaped electrode.

5. The preparation method according to claim 1, wherein, after step (9), the method further comprises following steps:
    repeating stacking based on the steps to prepare two or more layers of three-dimensional stacked memory, wherein an area of a rectangular region occupied by each insulating layer is decreased with an increase of number of layers stacked, a pin of an electrode of each layer is exposed, and the stacking is upwardly performed to form a step structure with a square frustum shape.

6. The preparation method according to claim 5, wherein, strip-shaped electrodes in odd-numbered layers have the same number, line width and direction except that the lengths thereof decrease with the increase of the number of layers; strip-shaped electrodes in even-numbered layers have the same number, line width and direction except that the lengths thereof decrease with the increase of the number of layers.

7. The preparation method according to claim 5, wherein, a region where a phase change unit of each layer is located is in a space overlapping region of upper and lower adjacent electrodes of the phase change unit of the layer.

8. The preparation method according to claim 5, wherein a local planarization operation is performed to insulating layers in even-numbered layers.

9. The preparation method according to claim 5, wherein insulating layers in odd-numbered layers and array of through holes thereon are realized through one time of photolithography, film preparation and peeling process.

10. A three-dimensional stacked memory obtained based on the preparation method according to claim 1.

11. The preparation method according to claim 2, wherein, in step (3), an area of the first phase change unit is larger than a cross-sectional area of the through hole and smaller than an area of an electrode overlapping region.

12. The preparation method according to claim 2, wherein, in step (4), a region where the first phase change unit is located is in a space overlapping region of the first strip-shaped electrode and the second strip-shaped electrode.

13. The preparation method according to claim 3, wherein, in step (4), a region where the first phase change unit is located is in a space overlapping region of the first strip-shaped electrode and the second strip-shaped electrode.

14. The preparation method according to claim 11, wherein, in step (4), a region where the first phase change unit is located is in a space overlapping region of the first strip-shaped electrode and the second strip-shaped electrode.

* * * * *